(12) United States Patent
Ueda

(10) Patent No.: US 11,532,895 B2
(45) Date of Patent: Dec. 20, 2022

(54) RADIO FREQUENCY MODULE AND COMMUNICATION DEVICE

(71) Applicant: Murata Manufacturing Co., Ltd., Kyoto (JP)

(72) Inventor: Hideki Ueda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/003,223

(22) Filed: Aug. 26, 2020

(65) Prior Publication Data

US 2020/0395681 A1   Dec. 17, 2020

Related U.S. Application Data

(63) Continuation of application No. PCT/JP2019/009361, filed on Mar. 8, 2019.

(30) Foreign Application Priority Data

Mar. 14, 2018   (JP) .............................. JP2018-047316

(51) Int. Cl.
*H01Q 1/24* (2006.01)
*H01Q 21/06* (2006.01)
(Continued)

(52) U.S. Cl.
CPC ......... *H01Q 21/065* (2013.01); *H01Q 1/2283* (2013.01); *H01Q 3/2611* (2013.01); *H01Q 5/35* (2015.01); *H01Q 23/00* (2013.01)

(58) Field of Classification Search
CPC ...... H01Q 21/065; H01Q 5/35; H01Q 1/2283; H01Q 3/2611; H01Q 23/00;
(Continued)

(56) References Cited

U.S. PATENT DOCUMENTS

2006/0160504 A1*  7/2006  Ichitsubo ................. H03F 3/24
                                                       455/127.1
2012/0307695 A1   12/2012  Yehezkely et al.
(Continued)

FOREIGN PATENT DOCUMENTS

JP       2008235447 A      10/2008
JP       2014096667 A       5/2014
(Continued)

OTHER PUBLICATIONS

International Search Report issued in Application No. PCT/JP2019/009361, dated May 21, 2019.
Written Opinion issued in Application No. PCT/JP2019/009361, dated May 21, 2019.

*Primary Examiner* — Jean B Jeanglaude
(74) *Attorney, Agent, or Firm* — Pearne & Gordon LLP

(57) ABSTRACT

A radio frequency module includes a first substrate having a first principal surface and a second principal surface on the opposite side to the first principal surface; a signal terminal which is provided on the first principal surface and through which a signal is transmitted to and received from an external circuit; a power supply terminal that is provided on the second principal surface and is supplied with a power supply signal; an antenna; and a radio frequency electronic component that is electrically connected to the signal terminal, the power supply terminal and the antenna, and controls transmission and reception of the antenna based on the signal and the power supply signal.

20 Claims, 10 Drawing Sheets

(51) Int. Cl.
*H01Q 5/35* (2015.01)
*H01Q 1/22* (2006.01)
*H01Q 3/26* (2006.01)
*H01Q 23/00* (2006.01)

(58) Field of Classification Search
CPC .......... H01Q 21/0025; H01Q 21/0093; H01Q 25/00; H01Q 1/38; H01L 24/16; H01L 2924/15159; H01L 2223/6683; H01L 2223/6622; H01L 2223/6677; H01L 2924/15192; H01L 2924/15313; H01L 2224/16235; H01L 2224/16227; H01L 23/66; H01L 21/565; H01L 23/3121; H01L 23/12; H04B 1/40
USPC ........................................................ 343/702
See application file for complete search history.

(56) References Cited

U.S. PATENT DOCUMENTS

| | | | |
|---|---|---|---|
| 2013/0314170 A1* | 11/2013 | Yamaguchi | H01P 1/10 333/101 |
| 2015/0234003 A1 | 8/2015 | Shiozaki et al. | |
| 2018/0062263 A1 | 3/2018 | Ueda | |
| 2018/0351595 A1* | 12/2018 | Tarui | H05K 1/0203 |
| 2019/0036229 A1* | 1/2019 | Kim | H01Q 21/293 |
| 2019/0173167 A1* | 6/2019 | Ariumi | H01Q 23/00 |

FOREIGN PATENT DOCUMENTS

| | | |
|---|---|---|
| JP | 2015023360 A | 2/2015 |
| JP | 2018033078 A | 3/2018 |
| WO | 2012081288 A1 | 6/2012 |
| WO | 2016056387 A1 | 4/2016 |

* cited by examiner

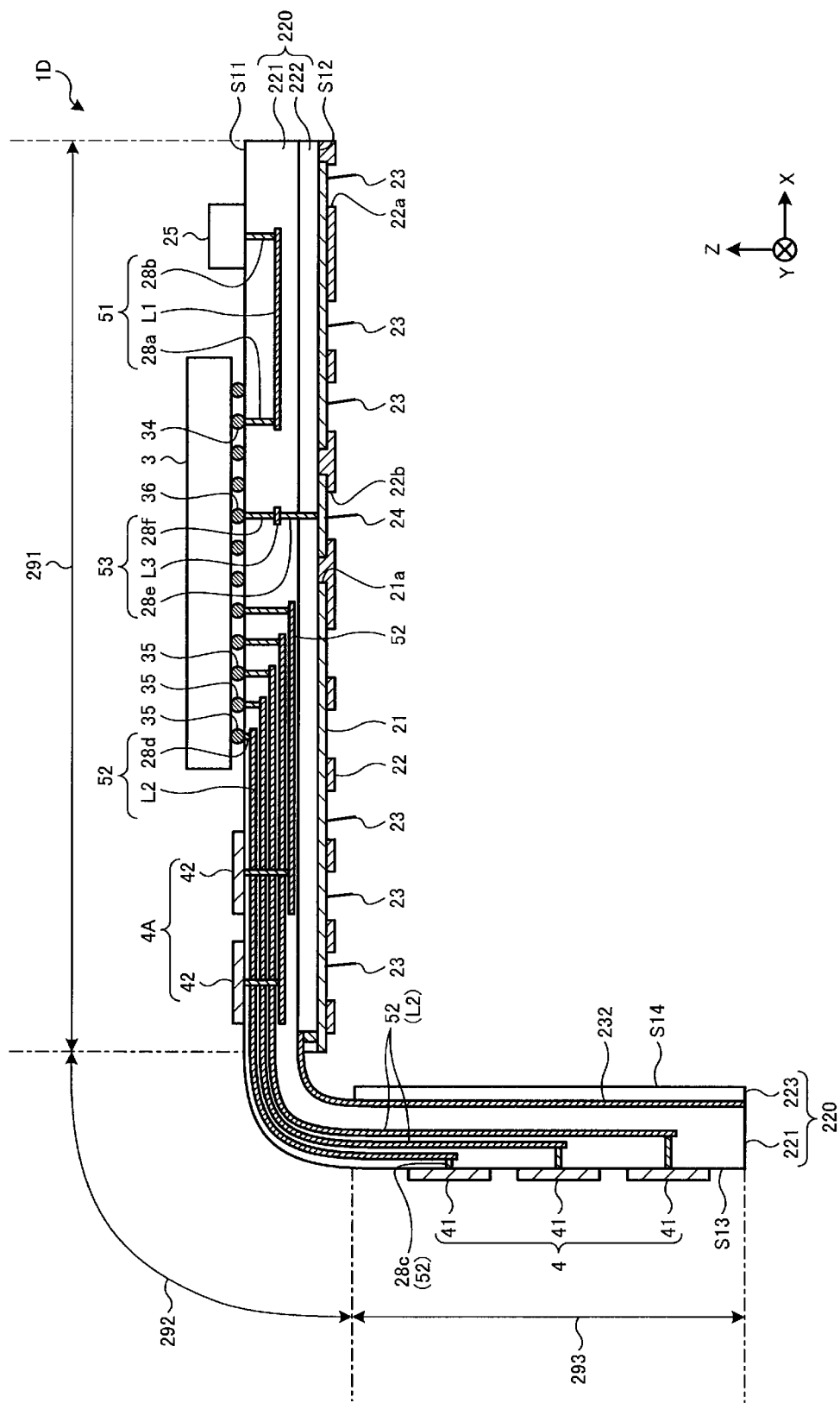

RADIO FREQUENCY MODULE AND COMMUNICATION DEVICE

This is a continuation of International Application No. PCT/JP2019/009361 filed on Mar. 8, 2019 which claims priority from Japanese Patent Application No. 2018-047316 filed on Mar. 14, 2018. The contents of these applications are incorporated herein by reference in their entireties.

BACKGROUND OF THE DISCLOSURE

Field of the Disclosure

The present disclosure relates to a radio frequency module and a communication device.

Description of the Related Art

Patent Document 1 discloses a millimeter-wave system in which a baseband module and a radio frequency module are connected with a single transmission line. The single transmission line transmits a superimposed signal in which a plurality of signals is superimposed. The superimposed signal includes an intermediate frequency (IF) signal, a local oscillator (Lo) signal, a control signal, and a power supply signal. A bias-T circuit for isolating the power supply signal from the other radio frequency signals (the IF, Lo, and control signals) is provided between the single transmission line and the radio frequency module.

Patent Document 1: U.S. Patent Application Publication No. 2012/0307695

BRIEF SUMMARY OF THE DISCLOSURE

In the millimeter-wave system of Patent Document 1, a plurality of signals is transmitted through a single transmission line. Because of this, there is a possibility that the radio frequency signals (the IF, Lo, and control signals) are coupled with a power supply line of an amplifier for radio frequency amplification included in the radio frequency module. As a result, in Patent Document 1, there is a possibility that a radio frequency signal in an unnecessary band oscillates to degrade the signal quality of an output signal from the radio frequency module.

An object of the present disclosure is to provide a radio frequency module and a communication device capable of suppressing the unnecessary oscillation of a radio frequency signal.

A radio frequency module of an aspect of the present disclosure includes a first substrate having a first principal surface and a second principal surface on the opposite side to the first principal surface; a signal terminal which is provided on the first principal surface and through which a signal is transmitted to and received from an external circuit; a power supply terminal that is provided on the second principal surface and is supplied with a power supply signal; an antenna; and a radio frequency electronic component that is electrically connected to the signal terminal, the power supply terminal and the antenna, and controls transmission and reception of the antenna based on the signal and the power supply signal.

A communication device of an aspect of the present disclosure includes the above-described radio frequency module and a baseband module connected to the signal terminal via a cable.

According to the radio frequency module and the communication device of the present disclosure, it is possible to suppress the unnecessary oscillation of a radio frequency signal.

BRIEF DESCRIPTION OF THE SEVERAL VIEWS OF THE DRAWINGS

FIG. 10 is a cross-sectional view for explaining a configuration of a radio frequency module according to a second modification of the third embodiment.

DETAILED DESCRIPTION OF THE DISCLOSURE

Hereinafter, embodiments of a radio frequency module and a communication device of the present disclosure will be described in detail based on the drawings. It should be noted that the present disclosure is not limited to the embodiments. It goes without saying that the embodiments are illustrative and that the configurations described in different embodiments may be partially replaced or combined with each other. In a second embodiment and subsequent embodiments, descriptions of matters common to those in a first embodiment will be omitted, and only different points will be described. In particular, similar effects derived from similar configurations will not be described successively for each embodiment.

First Embodiment

Figure 1:
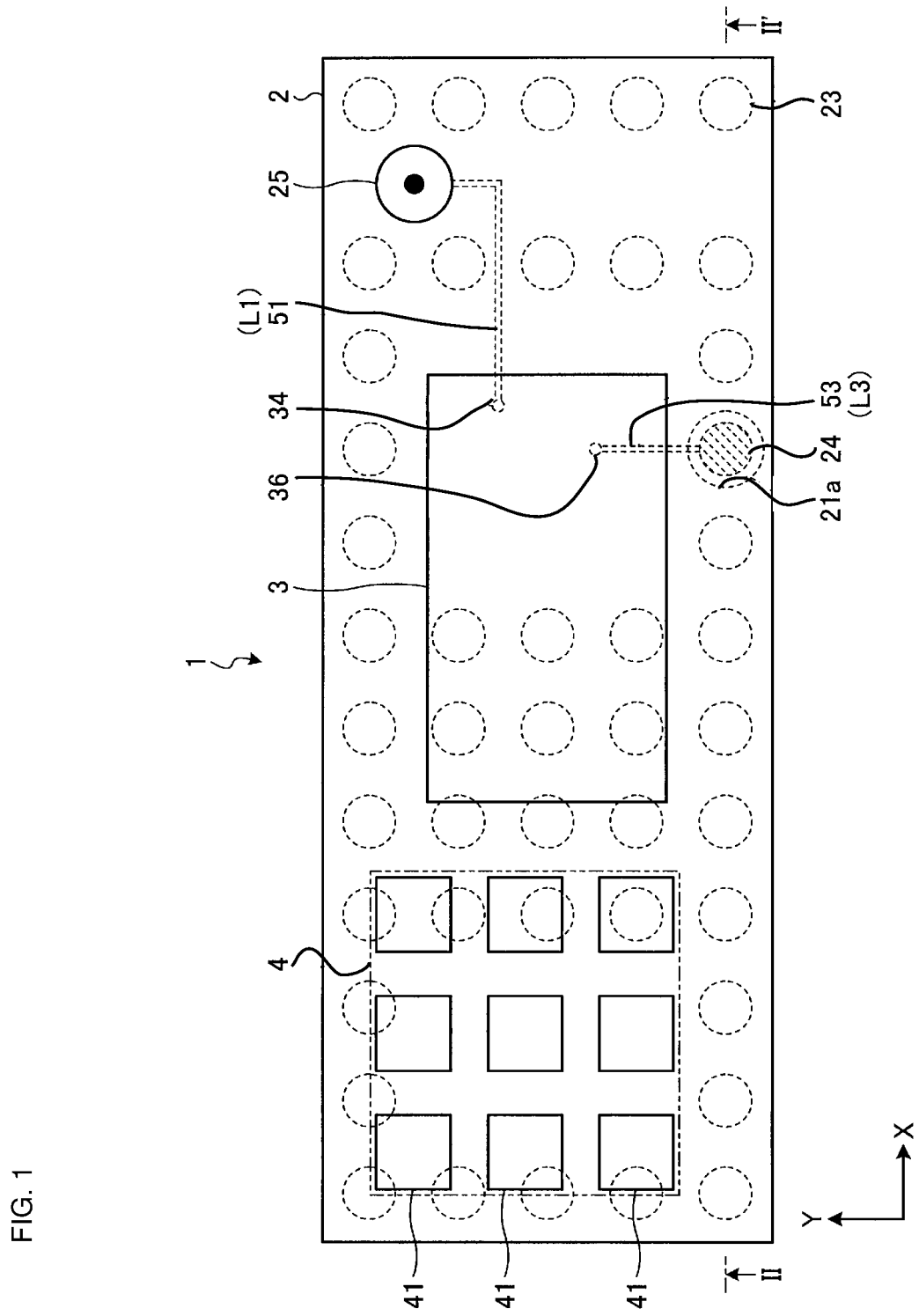
FIG. 1 is a see-through plan view of a radio frequency module according to a first embodiment.
Figure 2:
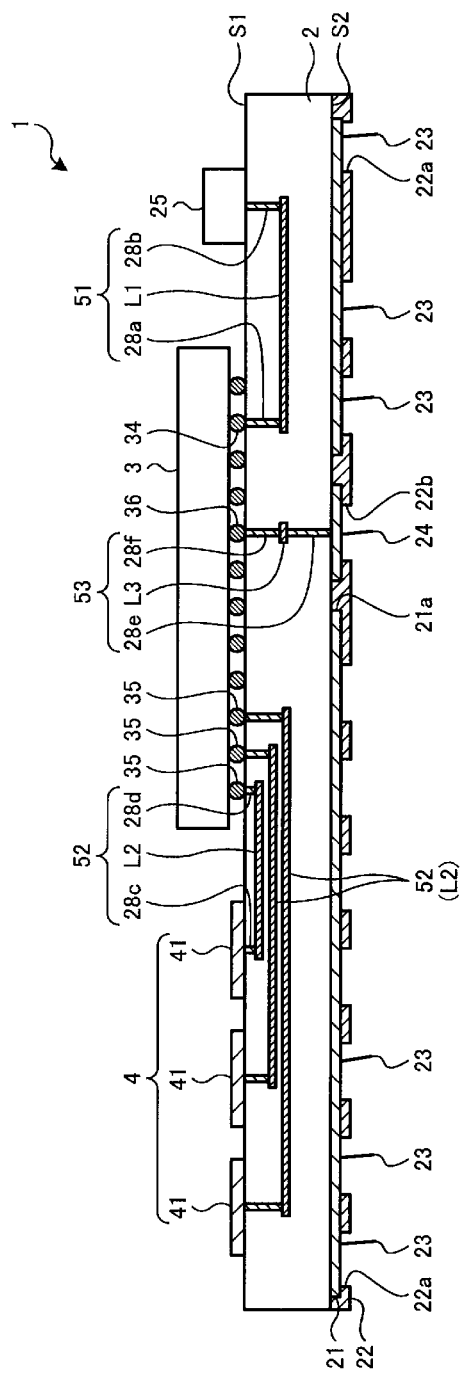
FIG. 2 is a cross-sectional view taken along a line II-II' in FIG. 1.

FIG. 1 is a see-through plan view of a radio frequency module according to a first embodiment. FIG. 2 is a cross-sectional view taken along a line II-II' in FIG. 1. In FIG. 1, a part of a ground terminal 23, a wiring line L3, and the like are schematically seen through and illustrated. As illustrated in FIGS. 1 and 2, a radio frequency module 1 includes a first substrate 2, a radio frequency electronic component 3, an antenna 4, a plurality of ground terminals 23, a power supply terminal 24, and a signal terminal 25. The radio frequency module 1 of the present embodiment is a radio frequency module equipped with an antenna. The radio frequency module 1 performs transmission and reception of a quasimillimeter wave band or a millimeter wave band (for example, equal to or more than 20 GHz and equal to or less than 300 GHz).

As illustrated in FIG. 2, the first substrate 2 has a first principal surface S1 and a second principal surface S2 on the opposite side to the first principal surface S1. In the present embodiment, the first principal surface S1 is an upper surface of the radio frequency module 1. The second principal surface S2 is a lower surface of the radio frequency module 1. The first substrate 2 is a multilayer dielectric substrate, where wiring lines L1, L2, L3 and the like, vias 28a, 28b, 28c, 28d, 28e, 28f and the like are provided in an inner layer thereof. The wiring lines L1, L2, L3 and the like, the vias 28a, 28b, 28c, 28d, 28e, 28f and the like, electrodes of a radiation element 41, a ground layer 21 and the like, the power supply terminal 24, and the signal terminal 25 are made of aluminum (Al), copper (Cu), gold (Au) or silver (Ag), or a metal mainly containing an alloy of these metals. As the first substrate 2, for example, a ceramic multilayer substrate is used. As the ceramic multilayer substrate, for example, a low temperature co-fired ceramic (LTCC) multilayer substrate is used. The first substrate 2 may be a multilayer resin substrate formed by laminating a plurality of resin layers each formed of a resin such as epoxy or polyimide. Further, the first substrate 2 may be a multilayer resin substrate formed by laminating a plurality of resin layers each formed of a liquid crystal polymer (LCP) having a low dielectric constant, may be a multilayer resin substrate formed by laminating a plurality of resin layers each formed of a fluorine-based resin, or may be a ceramic multilayer substrate sintered at a higher temperature than the LTCC.

The radio frequency electronic component 3, the antenna 4, and the signal terminal 25 are provided on the first principal surface S1 of the first substrate 2. The power supply terminal 24 and the plurality of ground terminals 23 are provided on the second principal surface S2 of the first substrate 2.

As illustrated in FIG. 1, the antenna 4 is an array antenna in which a plurality of radiation elements 41 is arranged in a matrix shape. The plurality of radiation elements 41 is arranged in an X-direction and also arranged in a Y-direction. The radio frequency module 1 is not limited to a configuration in which the plurality of radiation elements 41 is exposed on the surface of the first substrate 2, and for example, a protective layer for covering the plurality of radiation elements 41 may be provided. Note that the X-direction and the Y-direction are directions parallel to the first principal surface S1. The X-direction is a direction along one side of the first substrate 2. The Y-direction is orthogonal to the X-direction.

As illustrated in FIG. 2, each of the plurality of radiation elements 41 is connected to a second radio frequency terminal 35 of the radio frequency electronic component 3 via a second signal path 52. The second signal path 52 is separately provided for each of the radiation elements 41. The second signal path 52 includes the wiring line L2 and the vias 28c and 28d. The wiring line L2 is provided in the inner layer or on the surface of the first substrate 2. The via 28c electrically connects one end of the wiring line L2 to the radiation element 41. The via 28d electrically connects the other end of the wiring line L2 to the second radio frequency terminal 35.

As a result, the radio frequency electronic component 3 is able to supply a radio frequency signal RF (see FIG. 3) to each of the radiation elements 41. When the radio frequency signal RF is supplied, a current flows in a predetermined direction in the radiation element 41, and a polarized wave parallel to the current flowing direction is radiated. The radio frequency module 1 provides a desired radiation pattern (directivity) by controlling the arrangement of the radiation elements 41, the amplitude and phase of the radio frequency signal RF to be excited, and the like.

The radio frequency electronic component 3 is electrically connected to the signal terminal 25, the power supply terminal 24, and the antenna 4. The radio frequency electronic component 3 is a circuit configured to control the transmission and reception of the antenna 4, based on various radio frequency signals (the intermediate frequency signal IF, the local oscillator signal Lo, and a control signal Cntr (see FIG. 3)) and a power supply signal DC (see FIG. 3). The radio frequency electronic component 3 is, for example, a radio frequency integrated circuit (RFIC). As illustrated in FIG. 2, the radio frequency electronic component 3 is mounted on the first principal surface S1 by, for example, flip chip bonding via a plurality of terminals such as a first radio frequency terminal 34, the second radio frequency terminal 35, and an electronic component power supply terminal 36.

As illustrated in FIG. 2, the signal terminal 25 is provided on the first principal surface S1, and transmits a signal between the radio frequency module 1 and an external circuit (not illustrated in FIG. 2). The signal terminal 25 is connected to a baseband module 101 (see FIG. 3), which is an external circuit, and radio frequency signals such as the intermediate frequency signal IF, the local oscillator signal Lo, the control signal Cntr, and the like are transmitted therethrough. The signal terminal 25 is, for example, a coaxial connector capable of being connected to a coaxial cable.

The radio frequency electronic component 3 and the signal terminal 25 are electrically connected via a first signal path 51 provided in the first substrate 2. The first signal path 51 passes through the first substrate 2, and both one end and the other end thereof are disposed on the first principal surface S1. Specifically, the first signal path 51 includes the wiring line L1 and vias 28a, 28b, which are electrically connected. The wiring line L1 is provided in the inner layer, on the surface, or the like of the first substrate 2.

As illustrated in FIG. 1, the signal terminal 25, the radio frequency electronic component 3, and the antenna 4 are provided at positions that do not overlap each other in a plan view. A plurality of signal terminals 25 may be disposed. In this case, different intermediate frequency signals IF, local oscillator signals Lo, and control signals Cntr are transmitted to the plurality of signal terminals 25.

Figure 3:
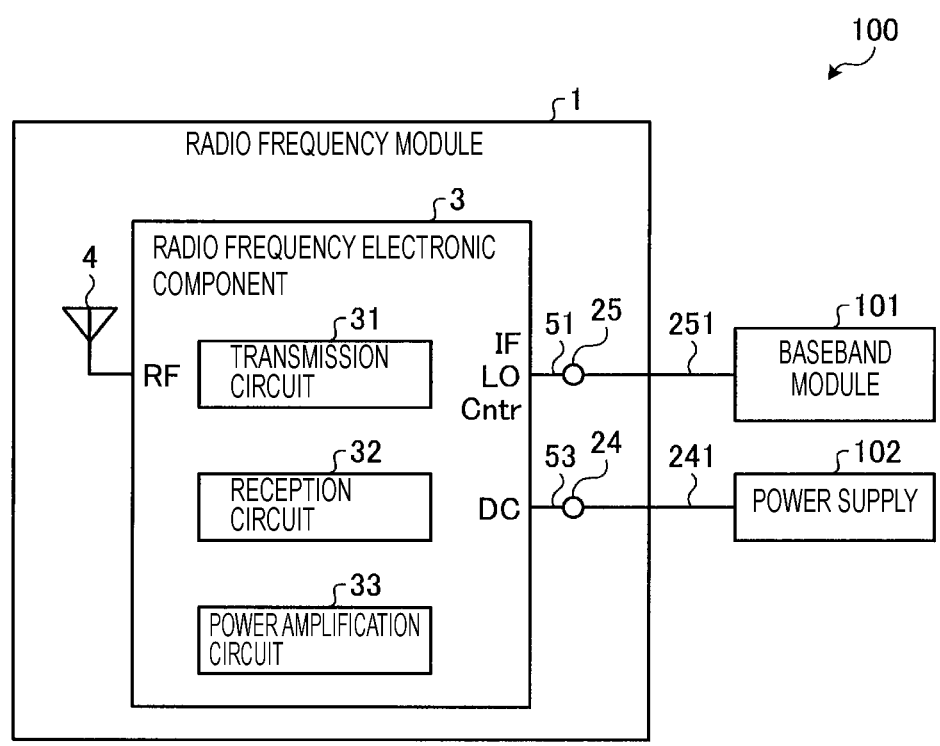
FIG. 3 is a block diagram illustrating a configuration example of a communication device including the radio frequency module according to the first embodiment.

As illustrated in FIG. 2, the power supply terminal 24 is provided on the second principal surface S2, and is supplied with the power supply signal DC from a power supply 102 (see FIG. 3). The power supply signal DC is, for example, a direct-current voltage signal. The radio frequency electronic component 3 and the power supply terminal 24 are electrically connected via a power supply signal path 53 provided in the first substrate 2. The power supply signal path 53 passes through the inside of the first substrate 2, and one end thereof is disposed on the first principal surface S1 while the other end thereof is disposed on the second principal surface S2. Specifically, the power supply signal path 53 includes the wiring line L3 and vias 28e, 28f, which are electrically connected. The wiring line L3 is provided in the inner layer or on the surface of the first substrate 2.

With this configuration, in the radio frequency module 1 of the present embodiment, the signal terminal 25 for transmitting various radio frequency signals and the power supply terminal 24 are isolated to be disposed on the first principal surface S1 and the second principal surface S2, respectively. Accordingly, it is possible to suppress a situation in which a radio frequency signal is coupled to the power supply line (including, for example, the power supply signal path 53) of the radio frequency electronic component 3, as compared to a case where various radio frequency signals and the power supply signal DC are transmitted through a single transmission line. As a result, it is possible for the radio frequency module 1 to suppress the unnecessary oscillation of a radio frequency signal. Further, in the present embodiment, it is unnecessary to provide a circuit such as a bias-T circuit for isolating the radio frequency signal and the power supply signal from each other. This makes it possible to suppress the circuit scale of the radio frequency module 1. Further, the radio frequency module 1 is able to suppress the degradation in signal quality of the radio frequency signal, the generation of spurious noise, or the like in the bias-T circuit or the like.

Various radio frequency signals such as the intermediate frequency signal IF, the local oscillator signal Lo, and the control signal Cntr are transmitted via the signal terminal 25 and the first signal path 51. The power supply signal DC is transmitted via the power supply terminal 24 and the power supply signal path 53. In other words, the various radio frequency signals and the power supply signal DC are transmitted through different paths.

In the radio frequency module 1, the antenna 4 and the radio frequency electronic component 3 are provided on the principal surface on the opposite side to the power supply terminal 24 with respect to the first substrate 2. Because of this, the second principal surface S2 may be easily mounted on a motherboard of a mobile wireless terminal or the like.

When the radio frequency module 1 is mounted on a motherboard, the power supply signal DC is supplied via the motherboard. In this case, a cable for supplying the power supply signal DC is unnecessary and the configuration of the radio frequency module 1 is simplified, so that it is possible to suppress a situation in which the cable operates as an antenna. Because of this, it is possible to suppress the degradation in antenna characteristics due to the presence of the cable.

As illustrated in FIG. 2, the plurality of ground terminals 23 is provided on the second principal surface S2, and is electrically connected to, for example, the ground of a motherboard. The ground layer 21 is provided on a substantially entire surface of the second principal surface S2. An insulation layer 22 covers the ground layer 21, and a plurality of openings 22a is provided therein. The insulation layer 22 is made of, for example, a resin material such as a resist. Of the ground layer 21, a portion exposed from the opening 22a is the ground terminal 23.

The power supply terminal 24 is provided on the second principal surface S2 of the first substrate 2, on which the ground layer 21 is provided. The power supply terminal 24 is provided inside an opening 21a of the ground layer 21. The ground layer 21 is provided around the power supply terminal 24, and the power supply terminal 24 is spaced apart from the ground layer 21. In the insulation layer 22, an opening 22b is provided at a position overlapping with the power supply terminal 24. With this, the power supply terminal 24 is exposed from the insulation layer 22. The insulation layer 22 is an over-resist provided in such a manner that a part of the insulation layer 22 overlaps a circumferential edge of the power supply terminal 24, but may be a clearance-resist provided in such a manner that the insulation layer 22 does not overlap the power supply terminal 24.

With such a configuration, it is possible for the radio frequency module 1 to be mounted on the motherboard of a mobile wireless terminal or the like via bumps 29 (see FIG. 7) formed on the ground terminals 23 and the power supply terminal 24. With this, the heat dissipation characteristics of the radio frequency module 1 are improved.

As illustrated in FIG. 1, the plurality of ground terminals 23 is arranged in the X-direction and Y-direction. The ground terminals 23, in a plan view, may be provided at positions overlapping with the signal terminal 25, the radio frequency electronic component 3 and the antenna 4, or may be provided at positions overlapping with none of them. The power supply terminal 24 is disposed between two ground terminals 23 adjacent to each other in the X-direction. With this, the radio frequency module 1 may suppress the coupling between the power supply signal DC and the radio frequency signal. Further, the radio frequency module 1 may suppress the radiation of low frequency noise superimposed on the power supply line to the outside.

The power supply terminal 24, in a plan view, may be provided at a position overlapping with the radio frequency electronic component 3 and the antenna 4, or may be provided at a position overlapping with none of them. The radio frequency module 1 may include a peripheral component such as a radio frequency chip component, in addition to the radio frequency electronic component 3.

(Communication Device)

FIG. 3 is a block diagram illustrating a configuration example of a communication device including a radio frequency module according to the first embodiment. As illustrated in FIG. 3, a communication device 100 includes the above-described radio frequency module 1, baseband module 101, and power supply 102. The baseband module 101 is connected to the signal terminal 25 via a cable 251. When performing transmission, the baseband module 101 supplies the intermediate frequency signal IF, the local oscillator signal Lo, and the control signal Cntr to the radio frequency module 1 via the single cable 251. The cable 251 is, for example, a coaxial cable. When performing reception, the baseband module 101 receives the intermediate frequency signal IF from the radio frequency module 1 via the cable 251. The baseband module 101 may be disposed at a position separated from the radio frequency module 1 in an electronic device such as a mobile wireless terminal.

The power supply 102 is connected to the power supply terminal 24 via a connection wiring line 241 of a motherboard, and supplies the power supply signal DC to the radio frequency module 1. The power supply 102 may be a power supply included in a host IC, or may be a power supply of the electronic device.

The radio frequency electronic component 3 of the radio frequency module 1 includes a transmission circuit 31, a reception circuit 32, and a power amplification circuit 33. The transmission circuit 31 modulates the intermediate frequency signal IF to a radio frequency signal RF (for example, 60 GHz) based on the intermediate frequency signal IF, the local oscillator signal Lo, and the control signal Cntr.

The power amplification circuit 33 amplifies the inputted radio frequency signal RF based on the power supply signal DC. The power amplification circuit 33 supplies the amplified radio frequency signal RF to the antenna 4. Further, the power amplification circuit 33 amplifies a received radio frequency signal RF and outputs the amplified radio frequency signal RF to the reception circuit 32.

At the time of reception, the antenna 4 supplies the received radio frequency signal RF to the reception circuit 32. The reception circuit 32 demodulates the received radio frequency signal to the intermediate frequency signal IF, and supplies the demodulated intermediate frequency signal IF to the baseband module 101.

Various radio frequency signals such as the intermediate frequency signal IF, the local oscillator signal Lo, and the control signal Cntr are supplied to the signal terminal 25 through the single cable 251. The power supply signal DC is supplied to the power supply terminal 24 through the connection wiring line 241 of the motherboard. As a result, the communication device 100 may suppress the coupling of the radio frequency signal to the power supply line of the radio frequency electronic component 3.

Second Embodiment

Figure 4:
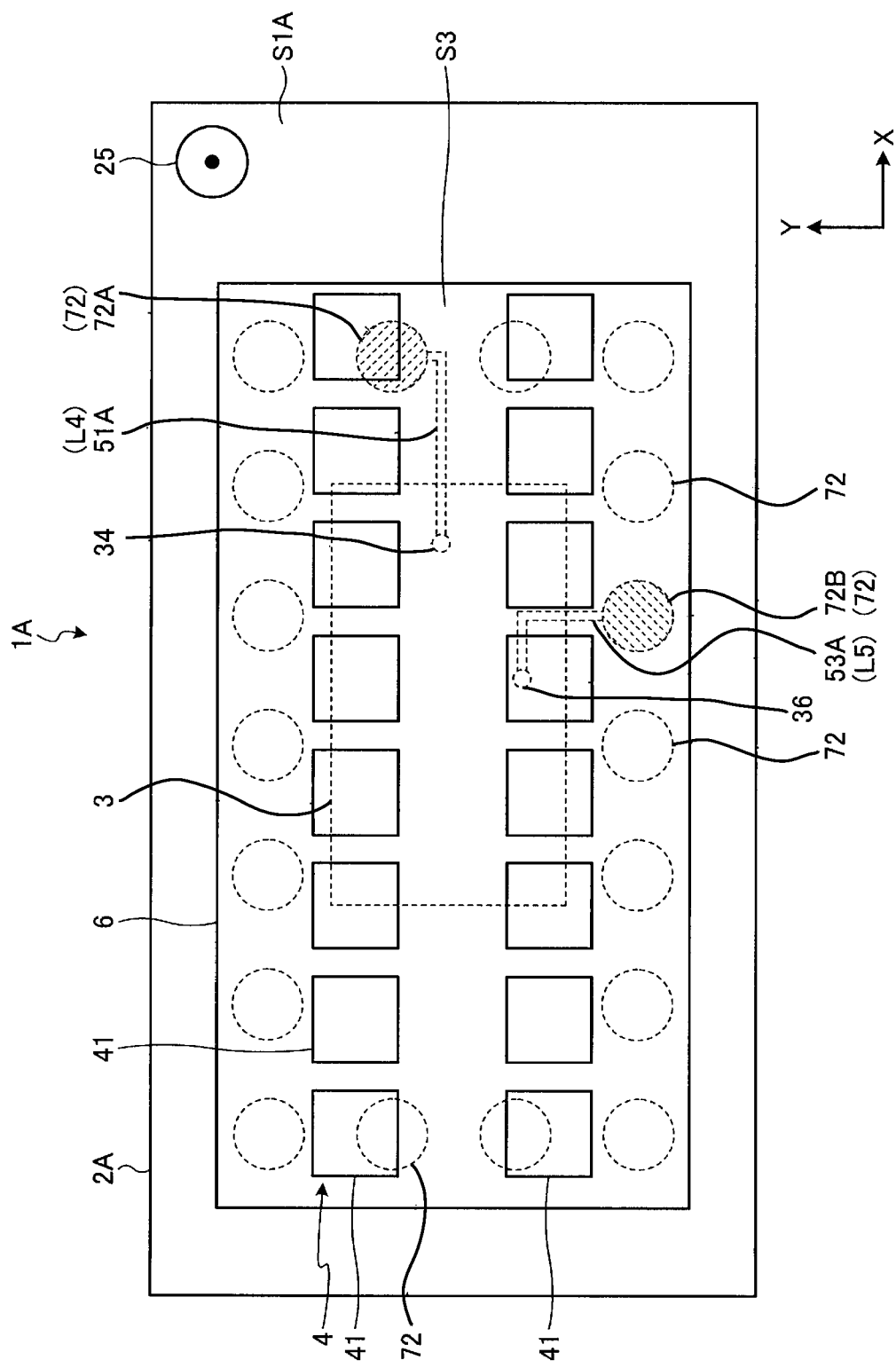
FIG. 4 is a see-through plan view of a radio frequency module according to a second embodiment.
Figure 5:
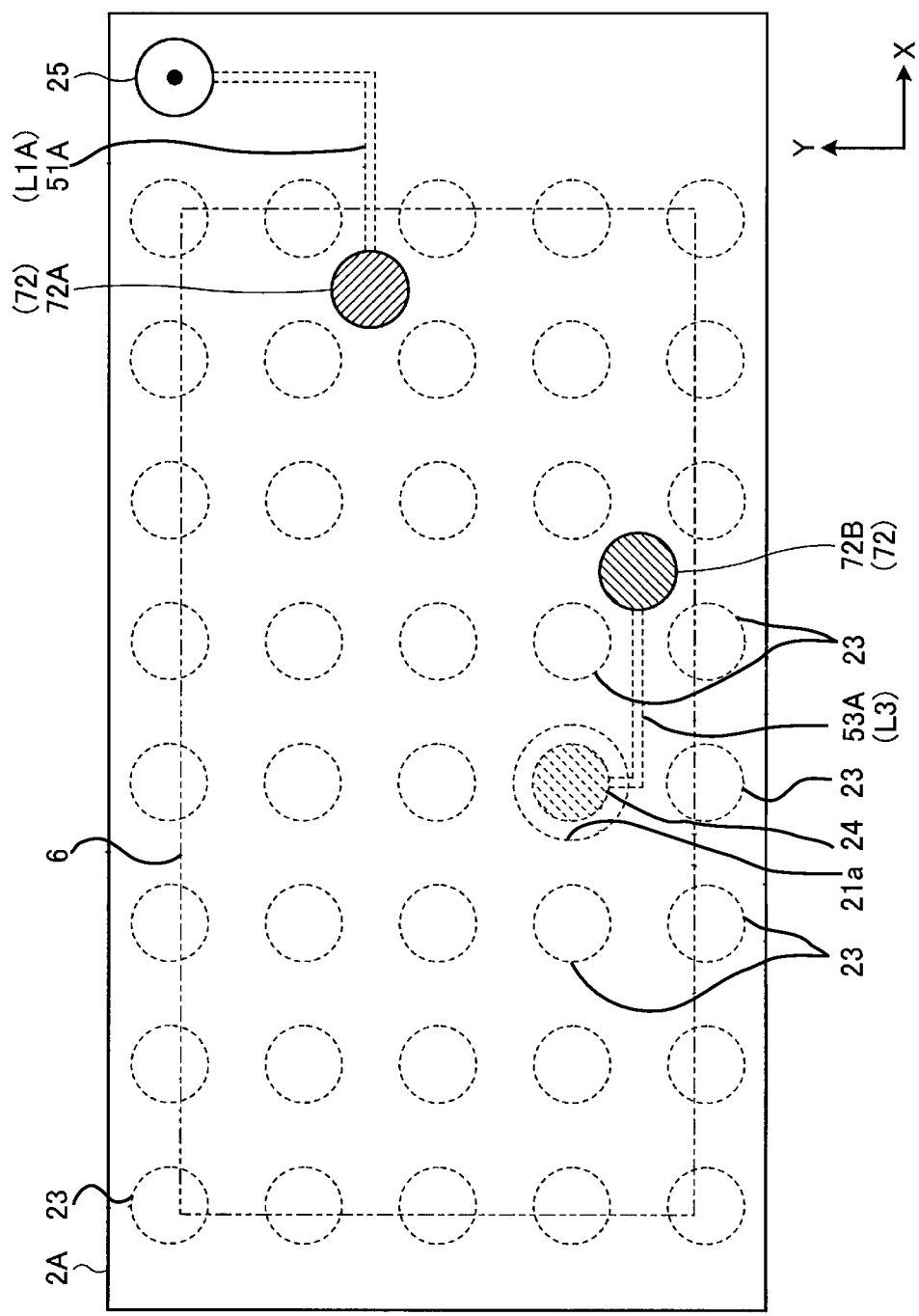
FIG. 5 is a see-through plan view illustrating a first substrate of the radio frequency module according to the second embodiment.
Figure 6:
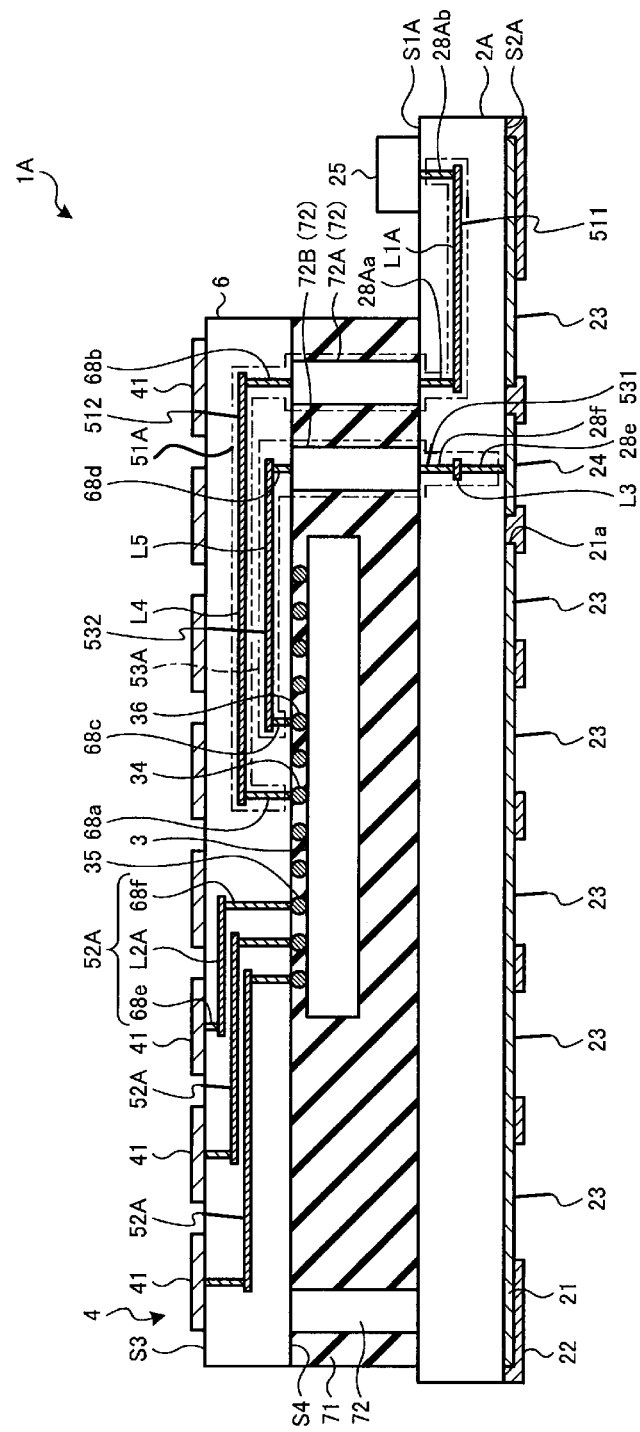
FIG. 6 is a cross-sectional view for explaining a configuration of the radio frequency module according to the second embodiment.

FIG. 4 is a see-through plan view of a radio frequency module according to a second embodiment. FIG. 5 is a see-through plan view illustrating a first substrate of the radio frequency module according to the second embodiment. FIG. 6 is a cross-sectional view for explaining a configuration of the radio frequency module according to the second embodiment. FIG. 6 is schematically illustrated in order to explain a first signal path 51A, a second signal path 52A, and a power supply signal path 53A.

In the second embodiment, a configuration in which a radio frequency module 1A includes a first substrate 2A and a second substrate 6 unlike the first embodiment, will be described. As illustrated in FIG. 6, in the radio frequency module 1A, the second substrate 6 has a third principal surface S3 and a fourth principal surface S4 on the opposite side to the third principal surface S3. The fourth principal surface S4 of the second substrate 6 is disposed to face a first principal surface S1A of the first substrate 2A.

The second substrate 6 is a multilayer dielectric substrate, where wiring lines L2A, L4, L5 and the like, vias 68a, 68b, 68c, 68d, 68e, 68f and the like, and the like are provided in an inner layer thereof. For example, a low temperature co-fired ceramic multilayer substrate or the like is used for the second substrate 6, similarly to the first substrate 2A. As illustrated in FIGS. 4 and 5, an outer shape of the second substrate 6 is smaller than that of the first substrate 2A.

As illustrated in FIG. 6, an antenna 4 is provided on the third principal surface S3 of the second substrate 6. A radio frequency electronic component 3 is mounted on the fourth principal surface S4 of the second substrate 6 via a plurality of terminals such as a first radio frequency terminal 34, a second radio frequency terminal 35, and an electronic component power supply terminal 36. As illustrated in FIG. 4, at least some of radiation elements 41 of the antenna 4 are disposed at positions overlapping with the radio frequency electronic component 3 in a plan view. Therefore, it is possible to reduce the area of the radio frequency module 1A in a plan view, and reduce the size of the radio frequency module 1A.

As illustrated in FIG. 6, a plurality of inter-substrate connecting members 72 is provided between the first substrate 2A and the second substrate 6, and is sealed by a mold member 71. Among the plurality of inter-substrate connecting members 72, a member serving as a part of the first signal path 51A is referred to as a first inter-substrate connecting member 72A. Among the plurality of inter-substrate connecting members 72, a member serving as a part of the power supply signal path 53A is referred to as a second inter-substrate connecting member 72B. In the following description, the inter-substrate connecting member 72, the first inter-substrate connecting member 72A, and the second inter-substrate connecting member 72B will be simply referred to as the inter-substrate connecting member 72 when they are not required to be distinguished from each other in the explanation.

The inter-substrate connecting member 72 is provided between the first principal surface S1A of the first substrate 2A and the fourth principal surface S4 of the second substrate 6. The inter-substrate connecting member 72 is a columnar member, and is formed of, for example, a conductive material such as copper (Cu) or silver (Ag). Terminals (not illustrated) for connecting to the inter-substrate connecting members 72 are provided on the first principal surface S1A of the first substrate 2A and the fourth principal surface S4 of the second substrate 6, and these terminals and the inter-substrate connecting members 72 are electrically connected to each other. The inter-substrate connecting member 72 is mounted on the second substrate 6 by, for example, reflow soldering or ultrasonic bonding.

As illustrated in FIG. 4, the plurality of inter-substrate connecting members 72 is arranged along an outer circumferential line of the second substrate 6 on the inner side of the outer circumferential line of the second substrate 6. The first inter-substrate connecting member 72A is disposed between the inter-substrate connecting members 72 adjacent to each other in the Y-direction. The second inter-substrate connecting member 72B is disposed between the inter-substrate connecting members 72 adjacent to each other in the X-direction. The inter-substrate connecting member 72 may be provided at a position overlapping with the antenna 4, or may be provided at a position not overlapping with the antenna 4.

As illustrated in FIG. 6, the radio frequency electronic component 3 and the inter-substrate connecting members 72 are sealed in the mold member 71. A composite resin in which an inorganic filler is contained in a thermosetting resin is used for the mold member 71. As the thermosetting resin, for example, an epoxy resin, a phenol resin, a cyanate resin, or the like is used. As the inorganic filler, aluminum oxide, silica, titanium dioxide, or the like is used. For forming the mold member 71, for example, a resin molding technique such as a potting technique, a transfer technique, or a compression molding technique is used.

A signal terminal 25 is provided on the first principal surface S1A of the first substrate 2A. The signal terminal 25 is disposed in a portion of the first principal surface S1A where the mold member 71 is not provided. As a result, the radio frequency module 1A protects the radio frequency electronic component 3 by the mold member 71 and facilitates the connection between an external circuit (for example, the baseband module 101 illustrated in FIG. 3) and the signal terminal 25. A power supply terminal 24 and a plurality of ground terminals 23 are provided on the second principal surface S2A of the first substrate 2A.

As illustrated in FIGS. 4 and 5, the signal terminal 25 is provided at a position that does not overlap with the second substrate 6. In FIG. 5, the second substrate 6 is indicated by a double-dot dash line, and the first inter-substrate connecting member 72A and the second inter-substrate connecting member 72B are indicated by solid lines. As illustrated in FIG. 5, the ground terminal 23 is provided at a position overlapping with the second substrate 6. The ground terminal 23 is also provided at a position that does not overlap with the second substrate 6. The plurality of ground terminals 23 is provided surrounding the power supply terminal 24.

As illustrated in FIG. 6, the radio frequency electronic component 3 and the signal terminal 25 are connected via the first signal path 51A. The first signal path 51A electrically connects the first substrate 2A to the second substrate 6. The first signal path 51A includes a first transmission line 511, the first inter-substrate connecting member 72A, and a second transmission line 512.

The first transmission line 511 is provided in the first substrate 2A, and includes a wiring line L1A and vias 28Aa and 28Ab, which are electrically connected. The wiring line L1A is provided in an inner layer of the first substrate 2A. As illustrated in FIG. 5, the wiring line L1A extends from a position overlapping with the second substrate 6 in a plan view to a position not overlapping with the second substrate 6.

The second transmission line 512 is provided in the second substrate 6, and includes the wiring line L4 and the vias 68a and 68b, which are electrically connected. The wiring line L4 is provided in the inner layer of the second substrate 6. As illustrated in FIG. 4, the wiring line L4 extends from a position that does not overlap with the radio frequency electronic component 3 to a position that overlaps with the radio frequency electronic component 3, in a plan view.

As illustrated in FIG. 6, the radio frequency electronic component 3 and the power supply terminal 24 are connected via the power supply signal path 53A. The power supply signal path 53A passes through at least the inside of the first substrate 2A in the thickness direction, and electrically connects the first substrate 2A to the second substrate 6. The power supply signal path 53A includes a first power supply signal transmission line 531, the second inter-substrate connecting member 72B, and a second power supply signal transmission line 532.

The first power supply signal transmission line 531 is provided in the first substrate 2A, and includes a wiring line L3 and vias 28e and 28f, which are electrically connected. The wiring line L3 is provided in the inner layer of the first substrate 2A. As illustrated in FIG. 5, the wiring line L3 and the power supply terminal 24 are provided at positions overlapping the second substrate 6 in a plan view. Since the wiring line L3 is provided in the inner layer of the first substrate 2A, the wiring line L3 may be provided overlapping with the ground terminal 23 or may be provided at a position not overlapping with the ground terminal 23.

As illustrated in FIG. 6, the second power supply signal transmission line 532 is provided in the second substrate 6, and includes the wiring line L5 and the vias 68c and 68d, which are electrically connected. The wiring line L5 is provided in the inner layer of the second substrate 6. As illustrated in FIG. 4, the wiring line L5 extends from a position overlapping with the radio frequency electronic component 3 to a position not overlapping with the radio frequency electronic component 3, in a plan view. A part of the wiring line L5 may be provided overlapping with the antenna 4.

As illustrated in FIG. 6, each of the plurality of radiation elements 41 is connected to the radio frequency electronic component 3 via the second signal path 52A. The second signal path 52A is separately provided for each of the radiation elements 41. The second signal path 52A includes the wiring line L2A and the vias 68e and 68f, which are electrically connected. The wiring line L2A is provided in the inner layer of the second substrate 6.

In the radio frequency module 1A of the present embodiment, the antenna 4 is provided on the second substrate 6, and the signal terminal 25 and the power supply terminal 24 are provided on the first substrate 2A. Accordingly, it is possible to suppress the coupling between a signal radiated from the antenna 4 and a power supply signal DC.

In the present embodiment, the signal terminal 25 and the power supply terminal 24 provided on the first substrate 2A are electrically connected to the radio frequency electronic component 3 provided on the second substrate 6 via the first signal path 51A and the power supply signal path 53A, respectively. Various radio frequency signals such as the intermediate frequency signal IF, the local oscillator signal Lo, and the control signal Cntr are transmitted through the signal terminal 25 and the first signal path 51A. The power supply signal DC is transmitted through the power supply terminal 24 and the power supply signal path 53A.

First Modification

Figure 7:
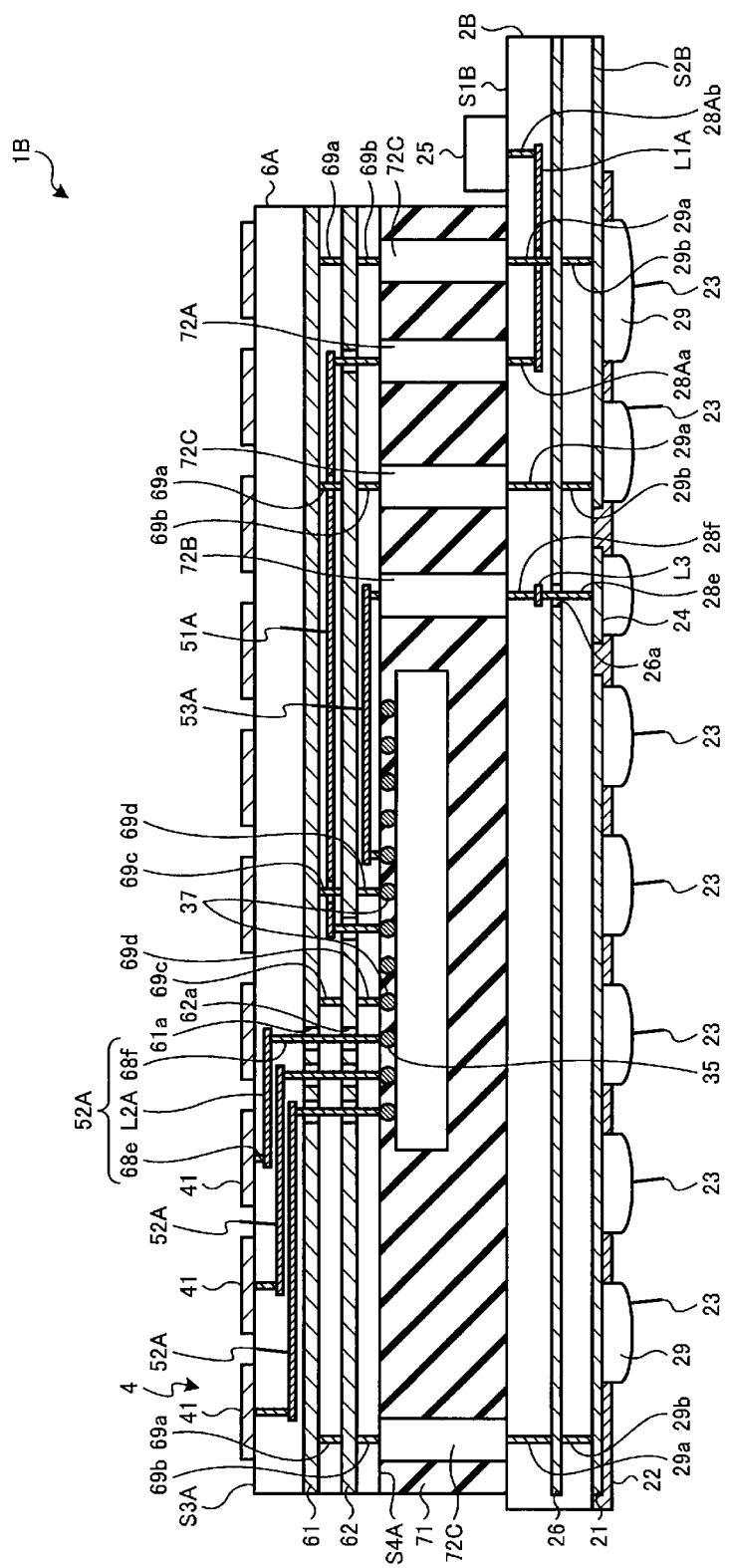
FIG. 7 is a cross-sectional view for explaining a configuration of a radio frequency module according to a first modification of the second embodiment.

FIG. 7 is a cross-sectional view for explaining a configuration of a radio frequency module according to a first modification of the second embodiment. In the present modification, a configuration in which a radio frequency module 1B includes ground layers 26, 61, and 62 unlike the second embodiment, will be described.

The ground layer 26 is provided in an inner layer of a first substrate 2B. The ground layer 26 is connected to an end portion on the first substrate 2B side of an inter-substrate connecting member 72C via a via 29a. Further, the ground layer 26 is connected to a ground layer 21 provided on a second principal surface S2B via a via 29b. The ground layer 26 is disposed between a signal terminal 25 and a power supply terminal 24. As a result, in the radio frequency module 1B, the signal terminal 25 and a first signal path 51A for transmitting various radio frequency signals are isolated from the power supply terminal 24 by the ground layer 26.

Each of ground terminals 23 is provided with a bump 29. The radio frequency module 1B can be mounted on a motherboard via the bumps 29. The bump 29 is, for example, a solder bump.

The ground layer 61 and the ground layer 62 are provided in inner layers of a second substrate 6A. The ground layer 61 and the ground layer 62 are provided in different layers, and are disposed to overlap with each other. The ground layer 61 is provided between an antenna 4 and the first signal path 51A and between the antenna 4 and a power supply signal path 53A in a direction perpendicular to a third principal surface S3A.

The ground layer 62 is provided between the power supply signal path 53A and the first signal path 51A and between the power supply signal path 53A and the antenna 4 in the direction perpendicular to the third principal surface S3A. The ground layer 61 and the ground layer 62 are electrically connected via vias 69a and 69c. The ground layer 62 is connected to an end portion on the second substrate 6A side of the inter-substrate connecting member 72C via a via 69b. Further, the ground layer 62 is connected to an electronic component ground terminal 37 via a via 69d. By providing the ground layers 61 and 62 as described above, it is possible to suppress the coupling among a signal radiated from the antenna 4, various radio frequency signals, and a power supply signal DC.

The first signal path 51A, a second signal path 52A, and the power supply signal path 53A are provided to be spaced apart from the ground layers 26, 61, and 62, respectively. For example, an opening 26a is provided in the ground layer 26, and a via 28e of the power supply signal path 53A passes through the opening 26a to be connected to the power supply terminal 24. The ground layers 61 and 62 are respectively provided with openings 61a and 62a, and a via 68f of the second signal path 52A passes through the openings 61a and 62a to be connected to a second radio frequency terminal 35.

The ground layer 26 is provided in a region overlapping with a substantially entire surface of the first substrate 2B. The ground layers 61 and 62 are provided in a region overlapping with a substantially entire surface of the second substrate 6A. The ground layers 26, 61, and 62 are not limited thereto, and may be partially provided.

Third Embodiment

Figure 8:
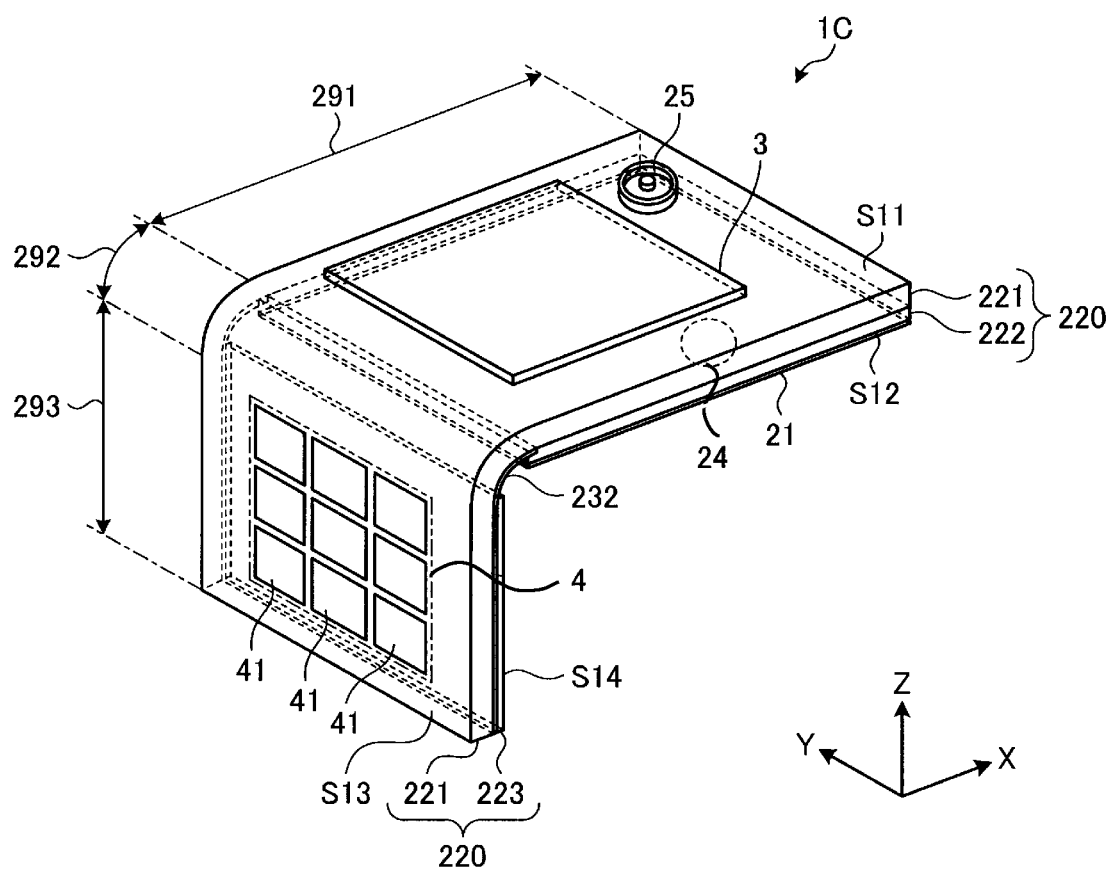
FIG. 8 is a perspective view of a radio frequency module according to a third embodiment.
Figure 9:
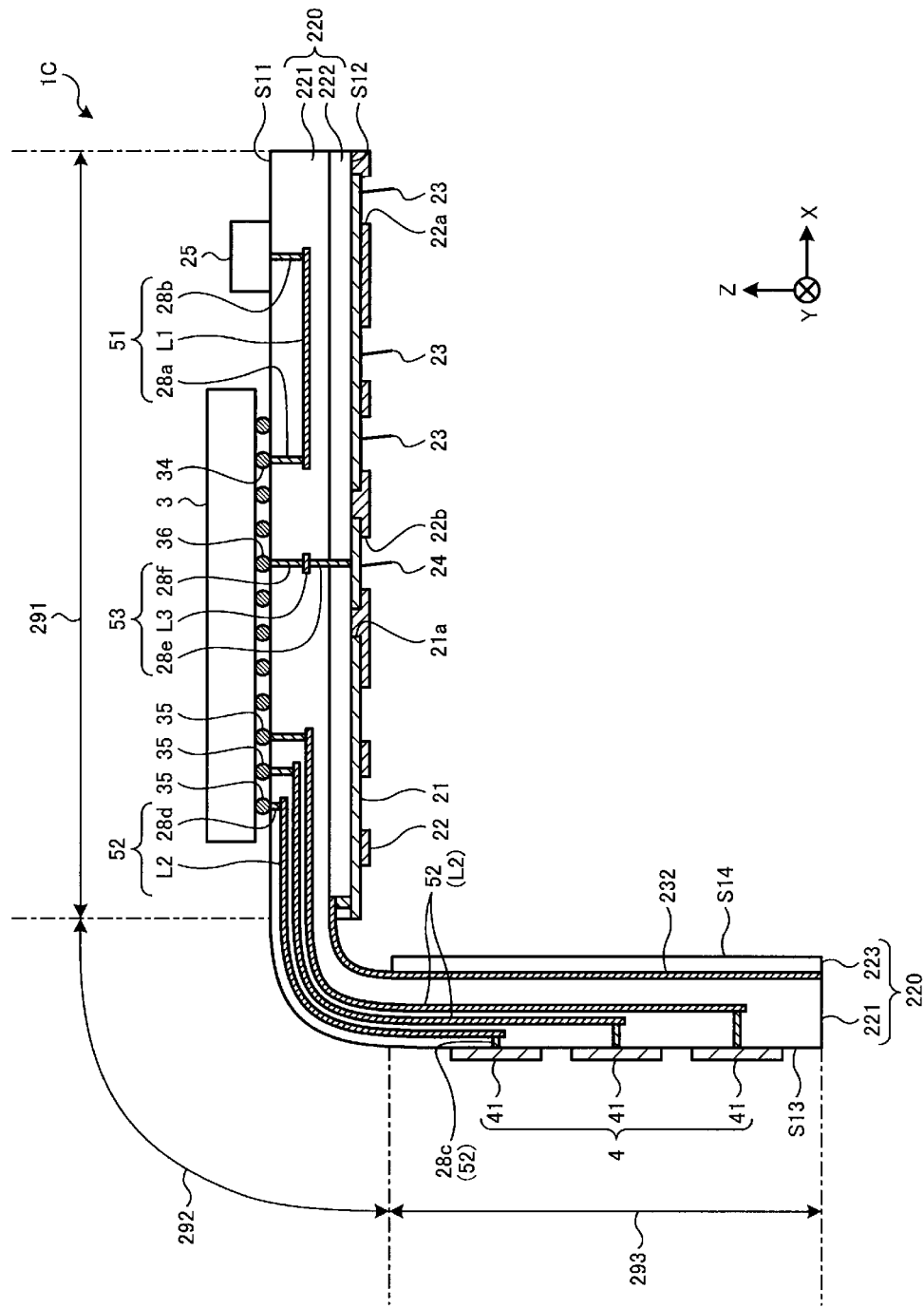
FIG. 9 is a cross-sectional view for explaining a configuration of the radio frequency module according to the third embodiment.

FIG. 8 is a perspective view of a radio frequency module according to a third embodiment. FIG. 9 is a cross-sectional view for explaining a configuration of the radio frequency module according to the third embodiment. In FIG. 8, in order to facilitate the understanding of the relationship between each of the constituent elements, various wiring lines, vias, and the like included in a first signal path 51, a second signal path 52, a power supply signal path 53, and the like are omitted.

In the third embodiment, a configuration in which a first substrate 220 of a radio frequency module 1C is bent unlike the first embodiment and the second embodiment, will be described. The first substrate 220 includes a flat plate-shaped section 291 (a first section), a section 292 (a second section), and a flat plate-shaped section 293 (a third section). The section 292 is provided between the section 291 and the section 293, and is thinner than the section 291 and section 293. The first substrate 220 is bent at the section 292.

The first substrate 220 includes a dielectric layer 221 (a first dielectric layer), a dielectric layer 222 (a second dielectric layer), and a dielectric layer 223. The dielectric layer 221 is formed extending from the section 291 to the section 293. The dielectric layer 221 is made of a material having flexibility (flexible material). The dielectric layer 221 is bent at the section 292. The dielectric layer 222 is formed in the section 291. The dielectric layer 223 is formed in the section 293. The first substrate 220 may be formed of an integral dielectric.

A plurality of radiation elements 41 is provided on a third principal surface S13 of the section 293. The plurality of radiation elements 41 is arranged in a Y-direction and also arranged in a Z-direction. The normal direction of the plurality of radiation elements 41 is an X-direction (−X-direction).

A ground layer 232 is formed extending from the section 291 to the section 293 on the dielectric layer 221. The dielectric layer 223 covers the ground layer 232 in the section 293 and constitutes a fourth principal surface S14 of the section 293. The ground layer 232 is connected to a ground layer 21 via a via. The ground layer 232 faces the plurality of radiation elements 41 in the X-direction.

A radio frequency electronic component 3 and a signal terminal 25 are provided on a first principal surface S11 of the section 291. The first signal path 51 is provided in the section 291, and connects the radio frequency electronic component 3 to the signal terminal 25. Ground terminals 23 and a power supply terminal 24 are provided on a second principal surface S12 of the section 291. The power supply signal path 53 passes through the section 291 so as to connect the radio frequency electronic component 3 to the power supply terminal 24.

The second signal path 52 is provided to extend from the section 291 to the section 293, and connects the radio frequency electronic component 3 to the plurality of radiation elements 41. The radio frequency electronic component 3 supplies radio frequency signals to each of the plurality of radiation elements 41 through the second signal path 52. The radio frequency electronic component 3 receives radio frequency signals from each of the plurality of radiation elements 41 through the second signal path 52.

In the radio frequency module 1C, the first substrate 220 is bent at the section 292. Accordingly, the normal directions of the plurality of radiation elements 41 are oriented in a direction parallel to the first principal surface S11 of the section 291. In the third embodiment, it is possible to transmit and receive a radio frequency signal including a polarized wave having a different excitation direction from that in the first embodiment and the second embodiment.

In addition, in the radio frequency module 1C, since the dielectric layer 221 is formed of a flexible material, it is possible to reduce the stress generated in the bent section 292. Therefore, in the section 291 and the section 293, the planarity of the surface of the first substrate 220 may be maintained. Because of this, it is possible to suppress a situation in which the normal directions of the plurality of radiation elements 41 are shifted from the desired direction. As a result, it is possible to suppress the degradation in characteristics of the radio frequency module 1C due to the bending of the first substrate 220.

Second Modification

FIG. 10 is a cross-sectional view for explaining a configuration of a radio frequency module according to a second modification of the third embodiment. As illustrated in FIG. 10, a radio frequency module 1D of the second modification includes an antenna 4A in addition to an antenna 4. A plurality of radiation elements 41 of the antenna 4 is provided on a third principal surface S13 of a section 293. A plurality of radiation elements 42 of the antenna 4A is provided on a first principal surface S11 of a section 291. The plurality of radiation elements 42 is provided in a region between a radio frequency electronic component 3 and a portion 292 on the first principal surface S11. Note that, however, the arrangement of the plurality of radiation elements 42 is not limited thereto, and they may be provided in a region that overlaps none of the radio frequency electronic component 3 and a signal terminal 25 on the first principal surface S11. Each of the plurality of radiation elements 41 and the plurality of radiation elements 42 is connected to the radio frequency electronic component 3 via a second signal path 52.

In the radio frequency module 1D of the second modification, the normal directions of the plurality of radiation elements 41 are oriented in the X-direction, and the normal directions of the plurality of radiation elements 42 are oriented in the Z-direction. The plurality of radiation elements 41 and the plurality of radiation elements 42 are able to transmit and receive radio frequency signals including polarized waves having different excitation directions from each other. Therefore, it is possible for the radio frequency module 1D to expand the coverage range of transmission and reception of the radio frequency signals as compared to the above-described first embodiment to the third embodiment.

Note that the above-described embodiments are intended to facilitate the understanding of the present disclosure and are not intended to limit the interpretation of the present disclosure. The present disclosure may be modified/improved without departing from the gist thereof, and the present disclosure also includes equivalents thereof.

The radio frequency modules 1, 1A, 1B, 1C and 1D, and the communication device 100 may take the following aspects.

(1) A radio frequency module of an aspect of the present disclosure includes:

a first substrate having a first principal surface and a second principal surface on the opposite side to the first principal surface;

a signal terminal which is provided on the first principal surface and through which a signal is transmitted to and received from an external circuit;

a power supply terminal that is provided on the second principal surface and is supplied with a power supply signal;

an antenna; and a radio frequency electronic component that is electrically connected to the signal terminal, the power supply terminal and the antenna, and controls transmission and reception of the antenna based on the signal and the power supply signal.

According to this configuration, the signal terminal for transmitting a radio frequency signal and the power supply terminal are isolated from each other, and are separated to be disposed on the first principal surface and the second principal surface, respectively. Therefore, it is possible to suppress the coupling of the radio frequency signal with the power supply line of the radio frequency electronic component, as compared with a case where various radio frequency signals and the power supply signal are transmitted through a single transmission line. As a result, it is possible for the radio frequency module to suppress the unnecessary oscillation of a radio frequency signal. Further, it is unnecessary to provide a circuit such as a bias-T circuit for isolating the radio frequency signal and the power supply signal from each other. This makes it possible to suppress the circuit scale of the radio frequency module. Further, the radio frequency module is able to suppress the degradation in signal quality of the radio frequency signal, the generation of spurious noise, or the like in the bias-T circuit or the like.

(2) In the radio frequency module described in the above (1), the antenna and the radio frequency electronic component are provided on a side opposite to the power supply terminal with respect to the first substrate.

According to this configuration, it is possible to easily mount the second principal surface on a motherboard of a mobile wireless terminal or the like. When the radio frequency module is mounted on a motherboard, the power supply signal is supplied via the motherboard. In this case, a cable for supplying the power supply signal is unnecessary, and the configuration of the radio frequency module is simplified. In addition, since there is no cable for supplying the power supply signal, it is possible to suppress a situation in which the cable operates as an antenna. Therefore, the radio frequency module is able to suppress the degradation in the antenna characteristics due to the presence of the cable.

(3) The radio frequency module described in the above (1) or (2) further includes:

a plurality of ground terminals provided on the second principal surface of the first substrate and connected to a ground, wherein the power supply terminal is disposed between the plurality of ground terminals adjacent to each other.

The power supply terminal is disposed between the plurality of ground terminals adjacent to each other, which brings a function as a shield; as a result, the radio frequency module is able to suppress the coupling between the power supply signal and the radio frequency signal. Further, the radio frequency module may suppress the radiation of low frequency noise superimposed on the power supply line to the outside.

(4) In the radio frequency module described in any one of the above (1) to (3), the antenna and the radio frequency electronic component are provided on the first principal surface of the first substrate, the radio frequency electronic component and the signal terminal are electrically connected via a first signal path provided in the first substrate, and the radio frequency electronic component and the power supply terminal are electrically connected via a power supply signal path, which passes through the first substrate and in which one end is disposed on the first principal surface while the other end is disposed on the second principal surface.

According to this configuration, radio frequency signals such as an intermediate frequency signal, a local oscillator signal, and a control signal are transmitted through the signal terminal and the first signal path. The power supply signal is transmitted through the power supply terminal and the power supply signal path. That is, the various radio frequency signals and the power supply signal are respectively transmitted from the terminals disposed on the different surfaces of the substrate through the different paths. As a result, the radio frequency module may suppress the coupling of the radio frequency signal to the power supply line (power supply signal path) of the radio frequency electronic component.

(5) The radio frequency module described in any one of the above (1) to (3) further includes:

a second substrate having a third principal surface and a fourth principal surface on the opposite side to the third principal surface, the fourth principal surface being disposed to face the first principal surface of the first substrate, wherein the antenna is disposed on the third principal surface of the second substrate, the radio frequency electronic component is provided on the fourth principal surface, the radio frequency electronic component and the signal terminal are connected via a first signal path that electrically connects the first substrate and the second substrate, and the radio frequency electronic component and the power supply terminal are connected via a power supply signal path that passes through at least an inside of the first substrate and electrically connects the first substrate and the second substrate.

According to this configuration, the antenna is provided on the second substrate, and the signal terminal and the power supply terminal are provided on the first substrate. Accordingly, it is possible to suppress the coupling between a signal radiated from the antenna and the power supply signal. Further, at least a part of the antenna may be disposed at a position overlapping with the radio frequency electronic component in a plan view. This makes it possible to reduce the area of the radio frequency module in the plan view, and reduce the size of the radio frequency module.

(6) The radio frequency module described in the above (5) further includes:

a mold member that is filled into between the first substrate and the second substrate to seal the radio frequency electronic component, wherein the signal terminal is disposed in a portion of the first principal surface where the mold member is not provided.

According to this configuration, the radio frequency electronic component is protected by the mold member, and an external circuit and the signal terminal are easily connected to each other.

(7) In the radio frequency module described in the above (1), the first substrate includes a first section and a third section that are flat plate-shaped, and a second section that is provided between the first section and the third section and is thinner than the first section, the first substrate is bent at the second section, the radio frequency electronic component and the signal terminal are provided on the first principal surface of the first section, the power supply terminal is provided on the second principal surface of the first section, and the antenna is provided on a third principal surface of the third section.

According to this configuration, the normal directions of a plurality of radiation elements 41 are oriented in a direction parallel to the first principal surface S11 of the section 291. Accordingly, it is possible to transmit and receive a radio frequency signal including a polarized wave having a different excitation direction, as compared with the case where the plurality of radiation elements 41 is provided on the same first principal surface S11 as the radio frequency electronic component 3.

(8) In the radio frequency module described in the above (7), the antenna is further provided on the first principal surface of the first section.

According to this configuration, the normal direction of each radiation element 41 of the antenna 4 and the normal direction of each radiation element 42 of the antenna 4A are oriented in different directions from each other. Accordingly, the plurality of radiation elements 41 and the plurality of radiation elements 42 are able to transmit and receive radio frequency signals including polarized waves having different excitation directions from each other. This makes it possible for the radio frequency module 1D to expand the coverage range of transmission and reception of the radio frequency signals.

(9) In the radio frequency module described in any one of the above (1) to (8), the antenna is an array antenna in which a plurality of radiation elements is arranged, and each of the plurality of radiation elements is connected to the radio frequency electronic component via a second signal path.

According to this configuration, the radio frequency module provides a desired radiation pattern (directivity) by controlling the arrangement of the radiation elements, the amplitude and phase of the radio frequency signal to be excited, and the like.

(10) A communication device includes:

the radio frequency module described in any one of the above (1) to (9); and a baseband module connected to the signal terminal via a cable.

According to this configuration, various radio frequency signals are supplied to the signal terminal through a single cable. A power supply signal is supplied to the power supply terminal via, for example, a motherboard. In other words, in the communication device, the various radio frequency signals and the power supply signal are transmitted to the radio frequency module through different paths. As a result, the communication device may suppress the coupling of the radio frequency signal to the power supply line of the radio frequency electronic component.

1, 1A, 1B, 1C, 1D RADIO FREQUENCY MODULE
2, 2A, 2B, 220 FIRST SUBSTRATE
3 RADIO FREQUENCY ELECTRONIC COMPONENT
4, 4A ANTENNA
6, 6A SECOND SUBSTRATE
21, 26, 61, 62 GROUND LAYER
22 INSULATION LAYER
23 GROUND TERMINAL
24 POWER SUPPLY TERMINAL
25 SIGNAL TERMINAL
29 BUMP
31 TRANSMISSION CIRCUIT
32 RECEPTION CIRCUIT
33 POWER AMPLIFICATION CIRCUIT
34 FIRST RADIO FREQUENCY TERMINAL
35 SECOND RADIO FREQUENCY TERMINAL
36 ELECTRONIC COMPONENT POWER SUPPLY TERMINAL
41, 42 RADIATION ELEMENT
51, 51A FIRST SIGNAL PATH
52, 52A SECOND SIGNAL PATH
53, 53A POWER SUPPLY SIGNAL PATH
71 MOLD MEMBER
72 INTER-SUBSTRATE CONNECTING MEMBER
100 COMMUNICATION DEVICE
101 BASEBAND MODULE
221, 222, 223 DIELECTRIC LAYER
291, 292, 293 SECTION
S1, S1A, S11 FIRST PRINCIPAL SURFACE
S2, S2A, S12 SECOND PRINCIPAL SURFACE
S3, S13 THIRD PRINCIPAL SURFACE
S4, S14 FOURTH PRINCIPAL SURFACE

What is claimed is:

1. A radio frequency module comprising:
a first substrate having a first principal surface and a second principal surface on an opposite side to the first principal surface;
a signal terminal that is provided on the first principal surface and through which a signal is transmitted to and received from an external circuit;
a power supply terminal that is provided on the second principal surface and is supplied with a power supply signal;
an antenna; and
a radio frequency electronic component that is electrically connected to the signal terminal, the power supply terminal and the antenna, and that controls transmission and reception of the antenna based on the signal and the power supply signal, wherein
the antenna and the radio frequency electronic component are provided on a side opposite to the power supply terminal with respect to the first substrate, and
at least one of the antenna or radio frequency component is provided on a different surface than the power supply terminal.

2. The radio frequency module according to claim 1, further comprising:
a plurality of ground terminals provided on the second principal surface of the first substrate and connected to a ground,
wherein the power supply terminal is disposed between two of the plurality of ground terminals adjacent to each other.

3. The radio frequency module according to claim 2,
wherein the antenna and the radio frequency electronic component are provided on the first principal surface of the first substrate,
the radio frequency electronic component and the signal terminal are electrically connected via a first signal path provided in the first substrate, and
the radio frequency electronic component and the power supply terminal are electrically connected via a power supply signal path, which passes through the first substrate and having a first end disposed on the first principal surface and a second end disposed on the second principal surface.

4. The radio frequency module according to claim 1,
wherein the antenna and the radio frequency electronic component are provided on the first principal surface of the first substrate,
the radio frequency electronic component and the signal terminal are electrically connected via a first signal path provided in the first substrate, and
the radio frequency electronic component and the power supply terminal are electrically connected via a power supply signal path, which passes through the first substrate and having a first end disposed on the first principal surface and a second end disposed on the second principal surface.

5. The radio frequency module according to claim 1,
wherein the first substrate includes a first section and a third section that are flat plate-shaped, and a second section that is provided between the first section and the third section, and that is thinner than the first section,
the first substrate is bent at the second section,
the radio frequency electronic component and the signal terminal are provided on the first principal surface of the first section,
the power supply terminal is provided on the second principal surface of the first section, and
the antenna is provided on a third principal surface of the third section.

6. The radio frequency module according to claim 5,
wherein the antenna is provided on the first principal surface of the first section.

7. The radio frequency module according to claim 1,
wherein the antenna is an array antenna in which a plurality of radiation elements is arranged, and
each of the plurality of radiation elements is connected to the radio frequency electronic component via a second signal path.

8. The radio frequency module according to claim 7,
wherein the plurality of radiation elements is arranged in a matrix shape.

9. The radio frequency module according to claim 7,
wherein the plurality of radiation elements is arranged in an X-direction along one side of the first substrate and in a Y-direction that is orthogonal to the X-direction.

10. A communication device comprising:
the radio frequency module according to claim 1; and
a baseband module connected to the signal terminal via a cable.

11. The radio frequency module according to claim 1,
further comprising a first ground layer provided in an inner layer of the first substrate.

12. The radio frequency module according to claim 11,
further comprising a second ground layer provided on the second principal surface of the first substrate.

13. The radio frequency module according to claim 12,
wherein the second ground layer is arranged between the signal terminal and the power supply terminal.

14. The radio frequency module according to claim 13,
wherein the first ground layer and the second ground layer are connected via a via.

15. A radio frequency module comprising:
a first substrate having a first principal surface and a second principal surface on an opposite side to the first principal surface;
a signal terminal that is provided on the first principal surface and through which a signal is transmitted to and received from an external circuit;
a power supply terminal that is provided on the second principal surface and is supplied with a power supply signal;
an antenna;
a radio frequency electronic component that is electrically connected to the signal terminal, the power supply terminal and the antenna, and that controls transmission and reception of the antenna based on the signal and the power supply signal; and
a second substrate having a third principal surface and a fourth principal surface on the opposite side to the third principal surface, the fourth principal surface being disposed to face the first principal surface of the first substrate, wherein
the antenna is disposed on the third principal surface of the second substrate,
the radio frequency electronic component is provided on the fourth principal surface,
the radio frequency electronic component and the signal terminal are connected via a first signal path that electrically connects the first substrate and the second substrate,
the radio frequency electronic component and the power supply terminal are connected via a power supply signal path that passes through at least the first substrate and electrically connects the first substrate and the second substrate, and
the antenna and the radio frequency electronic component are provided on a side opposite to the power supply terminal with respect to the first substrate.

16. The radio frequency module according to claim 15, further comprising:
a mold member that is filled into between the first substrate and the second substrate to seal the radio frequency electronic component,
wherein the signal terminal is disposed in a portion of the first principal surface where the mold member is not provided.

17. The radio frequency module according to claim 15,
wherein the antenna is an array antenna in which a plurality of radiation elements is arranged in an X-direction along one side of the first substrate and in a Y-direction that is orthogonal to the X-direction.

18. The radio frequency module according to claim 17,
wherein each of the plurality of radiation elements is connected to a second radio frequency terminal via a second signal path.

19. A communication device comprising:
the radio frequency module according to claim 15; and
a baseband module connected to the signal terminal via a cable.

20. A radio frequency module comprising:
a first substrate having a first principal surface and a second principal surface on an opposite side to the first principal surface;

a signal terminal that is provided on the first principal surface and through which a signal is transmitted to and received from an external circuit;

a power supply terminal that is provided on the second principal surface and is supplied with a power supply signal;

an antenna;

a radio frequency electronic component that is electrically connected to the signal terminal, the power supply terminal and the antenna, and that controls transmission and reception of the antenna based on the signal and the power supply signal; and a second substrate having a third principal surface and a fourth principal surface on the opposite side to the third principal surface, the fourth principal surface being disposed to face the first principal surface of the first substrate, wherein the antenna is disposed on the third principal surface of the second substrate, the radio frequency electronic component is provided on the fourth principal surface, the radio frequency electronic component and the signal terminal are connected via a first signal path that electrically connects the first substrate and the second substrate, the radio frequency electronic component and the power supply terminal are connected via a power supply signal path that passes through at least the first substrate and electrically connects the first substrate and the second substrate, the antenna and the radio frequency electronic component are provided on the first principal surface of the first substrate, the radio frequency electronic component and the signal terminal are electrically connected via a first signal path provided in the first substrate, and the radio frequency electronic component and the power supply terminal are electrically connected via a power supply signal path, which passes through the first substrate and having a first end disposed on the first principal surface and a second end disposed on the second principal surface.

* * * * *